United States Patent
Roth et al.

(10) Patent No.: US 12,235,299 B2
(45) Date of Patent: Feb. 25, 2025

(54) MEASUREMENT SYSTEM AND METHOD OF DETERMINING A CORRECTED AVERAGED POWER SIGNAL

(71) Applicant: Rohde & Schwarz GmbH & Co. KG, Munich (DE)

(72) Inventors: Alexander Roth, Munich (DE); Gregor Feldhaus, Munich (DE); Bernhard Gaede, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 360 days.

(21) Appl. No.: 17/933,716

(22) Filed: Sep. 20, 2022

(65) Prior Publication Data
US 2024/0094271 A1    Mar. 21, 2024

(51) Int. Cl.
*G01R 21/14*    (2006.01)
*G01R 21/133*    (2006.01)

(52) U.S. Cl.
CPC .......... *G01R 21/14* (2013.01); *G01R 21/133* (2013.01)

(58) Field of Classification Search
CPC  G01R 21/14; G01R 31/31721; G01R 21/133; G01R 35/005; G01R 29/26; G01R 23/16
See application file for complete search history.

(56) References Cited

U.S. PATENT DOCUMENTS

| | | | |
|---|---|---|---|
| 10,256,924 B1* | 4/2019 | Menzel | G01R 29/26 |
| 10,608,916 B2* | 3/2020 | Diegmann | H04L 43/0894 |
| 10,841,019 B1 | 11/2020 | Shah et al. | |
| 11,894,882 B2* | 2/2024 | Steffens | G01R 27/28 |
| 2005/0238094 A1 | 10/2005 | Bessho et al. | |

OTHER PUBLICATIONS

Lepek, A. and F.L. Walls, "Cross Correlation Analysis Improves Time Domain Measurements," 1993 IEEE International Frequency Control Symposium, 9 pages.
Nelson, C.W. et al., "A collapse of the cross-spectral function in phase noise metrology," Review of Scientific Instruments 85, 024705 (2014), 7 pages.

(Continued)

*Primary Examiner* — An H Do
(74) *Attorney, Agent, or Firm* — CHRISTENSEN O'CONNOR JOHNSON KINDNESS PLLC (57) ABSTRACT

A measurement system includes an input port, a signal splitter, first and second signal paths, an analysis circuit, and a control circuit. The input port is configured to receive an input signal to be measured. The signal splitter is configured to split the input signal into a first signal that is forwarded to the first signal path and a second signal that is forwarded to the second signal path. The analysis circuit is connected to the first signal path and the second signal path so as to receive both a first processed signal and a second processed signal. The analysis circuit is configured to a complex-valued product signal from the processed signals average the complex-valued product signal over a predetermined number of samples, and determine an averaged power signal based thereon. The control circuit is configured to directly or indirectly add an offset to the averaged power signal.

20 Claims, 4 Drawing Sheets

(56) References Cited

OTHER PUBLICATIONS

Nelson, Crawig W. et al., "Cross-spectral Collapse from Anti-correlated Thermal Noise in Power Splitters," Time and Frequency Division, National Institute of Standards and Technology, Boulder, CO, USA, IEEE 2016, 4 pages.

Oude Alink, Mark S. et al., "Spectrum Sensing With High Sensitivity and Interferer Robustness Using Cross-Correlation Energy Detection," IEEE Journal on Emerging and Selected Topics in Circuits and Systems, vol. 3, No. 4, Dec. 2013, 10 pages.

"Noise reduction by parallel cross-correlation measurements," Zurich Instruments, May 2019, Switzerland, 4 pages.

* cited by examiner

MEASUREMENT SYSTEM AND METHOD OF DETERMINING A CORRECTED AVERAGED POWER SIGNAL

FIELD OF THE DISCLOSURE

Embodiments of the present disclosure generally relate to a measurement system. Embodiments of the present disclosure further relate to a measurement method of determining a corrected averaged power signal.

BACKGROUND

A receiver using cross correlation techniques has two signal paths. Both signal paths are connected via a power splitter to an input connector and therefore receive the same signal. Calculating the cross correlation between the two signal paths suppresses the noise and phase noise of the receiver as the additive noise of the two signal paths is uncorrelated.

A known problem when measuring signals close to the thermal noise floor is the so called "spectral collapse", which results in the noise of the input signal being measured too low.

For example, if the phase noise of an oscillator is to be measured, the spectral collapse may lead to the phase noise being measured too low at least in some portions of the frequency spectrum.

In fact, the spectral collapse may pretend that measurements of the phase noise or of other measured quantities below about −174 dBm(Hz) are accurate, when they are in fact not trustworthy.

Thus, there is a need for a measurement system and a method that allow for correctly measuring signals close to the thermal noise floor.

SUMMARY

Embodiments of the present disclosure provide a measurement system. In an embodiment, the measurement system comprises an input port, a signal splitter, a first signal path, a second signal path, an analysis circuit, and a control circuit. The input port is configured to receive an input signal to be measured. The signal splitter comprises a common port that is connected to the input port so as to receive the input signal from the input port. The signal splitter comprises a first port being connected to the first signal path and a second port being connected to the second signal path. The signal splitter is configured to split the input signal into a first signal that is forwarded to the first signal path and a second signal that is forwarded to the second signal path. The first signal path is configured to process the first signal, thereby obtaining a first processed signal. The second signal path is configured to process the second signal, thereby obtaining a second processed signal. The analysis circuit is connected to the first signal path and the second signal path so as to receive both the first processed signal and the second processed signal. The analysis circuit is configured to perform a conjugate complex multiplication of the first processed signal and the second processed signal, thereby obtaining a complex-valued product signal. The analysis circuit is configured to average the complex-valued product signal over a predetermined number of samples, thereby obtaining an averaged product signal. The analysis circuit is configured to determine an averaged power signal based on the averaged product signal. The control circuit is configured to directly or indirectly add an offset to the averaged power signal.

The measurement system according to embodiments of the present disclosure is based on the idea to compensate for the effect of spectral collapse by adding the offset to the averaged power signal directly or indirectly.

Therein and in the following, the term "directly" is understood to mean that a preliminary averaged power signal is determined and the offset is added to the preliminary averaged power signal in order to obtain the averaged power signal.

Further, the term "indirectly" is understood to mean that an appropriate signal corresponding to the offset is added anywhere in the signal chain between the signal splitter and the analysis circuit, including the analysis circuit, as will be described in more detail below.

Irrespective of whether the offset is added directly or indirectly, the resulting averaged power signal is corrected for the spectral collapse, such that measurements, for example of a phase noise power density or of an amplitude noise power density, can be correctly conducted near the thermal noise floor by the measurement system according to embodiments of the present disclosure.

The components of the measurement system, for example the input port, the signal splitter, the first signal path, the second signal path, the analysis circuit, and/or the control circuit may at least partially be integrated into a single measurement device or measurement instrument.

In some embodiments, the input port, the signal splitter, the first signal path, the second signal path, the analysis circuit, and the control circuit are all integrated into a common measurement device or measurement instrument. For example, the measurement instrument may be a signal analyzer, a spectrum analyzer, a phase noise tester, an oscilloscope, or any other suitable measurement instrument.

In some embodiments, the signal splitter is configured to split the power of the input signal to be measured equally to the first signal path and to the second signal path. Accordingly, the signal splitter may also be called "power splitter".

In some embodiments, the analysis circuit is configured to average the complex-valued product signal over the predetermined number of samples, thereby obtaining the averaged product signal. By averaging over the predetermined number of samples, noise originating within the first signal path and the second signal path is selectively removed, as these noise contributions are uncorrelated with each other and thus cancel when performing the average over the complex-valued product signal. Thus, measurements can be performed with high precision. For example, a phase noise density or an amplitude noise density can be determined with high precision.

According to an aspect of the present disclosure, the offset is configured, for example, to compensate for anti-correlated thermal noise added by the signal splitter into the first signal path and the second signal path, for example the respective signals processed by the first signal path and the second signal path. The spectral collapse discussed above may at least partially be caused by the anti-correlated thermal noise that is added by the signal splitter into the first signal path and the second signal part path. Accordingly, by directly or indirectly adding the offset to the determined averaged power signal, the anti-correlated thermal noise caused by the signal splitter is compensated and measurements can reliably be conducted even in the vicinity of the thermal noise floor.

In an embodiment of the present disclosure, the control circuit is configured to add the offset to the complex-valued product signal. Accordingly, the offset may be added to the averaged power signal indirectly by adding a (constant) signal to the complex-valued product signal, i.e. within the analysis circuit.

It is noted that the analysis circuit may be configured to operate on digital signals. Accordingly, the offset may be established as a digital signal being added to the complex-valued product signal.

According to another aspect of the present disclosure, the averaged power signal is associated with, for example, a phase noise power density, an amplitude noise power density, a time domain power measurement, or an error vector magnitude measurement. In other words, the averaged power signal may represent or may be a phase noise power density, an amplitude noise power density, a time domain power measurement, or an error vector magnitude measurement. Thus, different types of measurements can be performed by the measurement system according to the present disclosure.

In a further embodiment of the present disclosure, the control circuit is configured to add the offset to the averaged product signal. Accordingly, the offset may be added to the averaged power signal indirectly by adding a (constant) signal to the averaged product signal, i.e. within the analysis circuit. In some embodiments, the offset is established as a digital signal being added to the averaged product signal.

A further aspect of the present disclosure provides that the analysis circuit is configured, for example, to determine an absolute value of the averaged product signal or a real value of the averaged product signal, and wherein the control circuit is configured to add the offset to the absolute value of the averaged product signal or the real value of the averaged product signal. Accordingly, the offset may be added to the averaged power signal directly by adding a (constant) signal to the absolute value of the averaged product signal or to the real value of the averaged product signal.

In some embodiments, the averaged power signal may correspond to the absolute value of the averaged product signal or to the real value of the averaged product signal.

In some embodiments, the offset is established as a digital signal being added to the absolute value of the averaged product signal or to the real value of the averaged product signal.

The control circuit may be configured to add a first partial offset in the first signal path and a second partial offset in the second signal path. In general, the first partial offset and the second partial offset are configured such that the resulting offset to the averaged power signal compensates for the unwanted spectral collapse.

In other words, instead of adding the offset by adding a single signal within the analysis circuit, the offset may also be added by adding the partial offsets in the first signal path and in the second signal path, respectively.

In some embodiments, the partial offsets may be digital signals that are added in a digital portion of the signal paths. Alternatively, the partial offsets may be analog signals that are added in an analog portion of the signal paths.

In some embodiments, the first partial offset is equal to the second partial offset. In other words, the same partial offset this added to both signal paths, such that the input signal is processed by the signal paths in a symmetric way.

According to an aspect of the present disclosure, the first signal path and the second signal path each comprise, for example, an analog-to-digital converter, respectively, wherein the first partial offset and the second partial offset are established as a digital signal that is added after the analog-to-digital converter, respectively. In other words, the first partial offset and the second partial offset are added in a digital portion of the first signal path and in a digital portion of the second signal path, respectively.

For example, the digital signal may be established as a wideband noise signal.

If the first signal path and/or the second signal path comprise(s) a Fourier transform circuit, the digital signal may be added upstream of the Fourier transform circuit, respectively.

In an embodiment of the present disclosure, the first signal path and the second signal path each comprise an analog-to-digital converter, respectively, wherein the first partial offset and the second partial offset are established as an analog signal that is added before the analog-to-digital converter, respectively. In other words, the first partial offset and the second partial offset are added in an analog portion of the first signal path and the second signal path, respectively.

In some embodiments, the measurement system may comprise at least one digital-to-analog converter (DAC), wherein the DAC is configured to convert a digital signal into the analog signal that is added before the analog-to-digital converters.

For example, the digital signal may be established as a wideband noise signal, such that the converted analog signal is an analog version of the wideband noise signal.

In a further embodiment of the present disclosure, the first port and the second port of the signal splitter are isolated from each other. Thus, it is ensured that noise originating in the first signal path and noise originating in the second signal path is uncorrelated and can thus be removed by the techniques described above, as the first signal path and the second signal path are isolated from each other.

For example, in some embodiments, the signal splitter is a Wilkinson divider. Accordingly, isolation between the output ports of the signal splitter, i.e. the first port and the second port of the signal splitter, is obtained while maintaining a matched condition on all ports, i.e. the common port, the first port, and the second port.

According to an aspect of the present disclosure, the measurement system is configured, for example, to measure a temperature of the signal splitter, an operating temperature of the measurement system and/or an ambient temperature, wherein the control circuit is configured to determine the offset based on the temperature of the signal splitter, based on the operating temperature and/or based on the ambient temperature.

In general, the noise floor rises with rising temperature, as the energy of the noise floor scales with k T, with k being the Boltzmann constant and T being the temperature. Likewise, the amount of anti-correlated noise added by the signal splitter to the first signal path and to the second signal path scales with the temperature of the signal splitter. This effect may be accounted for by determining the offset based on the temperature of the signal splitter, based on the operating temperature and/or based on the ambient temperature.

In other words, the averaged power signal is corrected with a temperature-dependent offset. In some embodiments, the averaged power signal is corrected for the temperature-dependent anti-correlated noise added by the signal splitter to the first signal path and to the second signal path with a temperature-dependent offset.

For example, only the ambient temperature may be measured. During operation, the temperature of the signal splitter can then be assumed to be higher than the ambient temperature by a characteristic difference. In other words, the temperature of the signal splitter may be estimated based on the measured ambient temperature.

Likewise, the temperature of the signal splitter may be estimated based on the operating temperature of the measurement system, which may be measured at any point of the measurement system other than the signal splitter itself. For example, a lookup-table may be provided comprising the temperature of the power splitter in dependence of the operating temperature.

As another example, the temperature of the signal splitter may be measured directly. As a further example, the temperature of the signal splitter may be estimated. For example, the temperature of the signal splitter may be estimated to be a usual operating temperature of the signal splitter.

According to another aspect of the present disclosure, the control circuit is configured, for example, to load a preliminary offset from a memory, and wherein the control circuit is configured to adapt the preliminary offset based on the temperature of the signal splitter, based on the operating temperature and/or based on the ambient temperature in order to obtain the offset that is added to the averaged power signal. The preliminary offset may correspond to an offset that has been previously determined for a specific temperature of the signal splitter, e.g. for a usual operating temperature of the signal splitter. As the actual temperature of the signal splitter may differ from the usual operating temperature, the preliminary offset may be corrected for the difference between the actual temperature of the signal splitter and the usual operating temperature of the signal splitter.

Therein, the actual temperature of the signal splitter may be determined as described above.

The measurement system may further comprise a termination load having a predefined electric resistance, wherein the termination load is connected to the input port, or wherein the termination load is connectable to the input port by a switch. The termination load has a known phase noise characteristic, as the phase noise generated by the termination load corresponds to k T. Thus, the termination load may be connected to the input port and the measurements described above may be performed on the termination load in order to determine the offset.

In some embodiments, the averaged power signal of the termination load may be determined as described above and may be compared with the known thermal floor of the termination load, i.e. with k T. The offset may be determined based on a difference between the determined averaged power signal of the termination load and the thermal floor k T.

For example, the analysis circuit or the control circuit may be configured to determine the offset.

In an embodiment of the present disclosure, the termination load is integrated into the measurement system, wherein the measurement system comprises an internal calibration line, wherein the internal calibration line is connected to the termination load, and wherein the internal calibration line is connectable to the input port by a switch. Thus, the measurement system may be configured to self-calibrate by connecting the termination load to the input port and determining the offset as described above.

If the termination load is connected to the input port, external signals may be switched off, such that only the signal of the termination load is processed.

As the termination load is integrated into the measurement system, for example into the measurement instrument, the temperature of the termination load may be equal to the temperature of the signal splitter. Thus, a particularly precise calibration of the offset may be performed.

In a further embodiment of the present disclosure, the first signal path and the second signal path are functionally identical. In other words, the two parallel signal paths are identically constructed, i.e. they comprise identically constructed electronic components. Thus, the two parallel signal paths process the input signal received from the device under test in the same way. However, noise originating in the first signal path is not correlated with noise originating in the second signal path, and thus cancels when performing the combined average of the complex-valued product signal described above.

Another aspect of the present disclosure provides that the first signal path and the second signal path each comprise, for example, a Fourier transform circuit, wherein the Fourier transform circuits are each configured to determine a Fourier transform of the respective signal processed in the respective signal path over a predetermined time interval.

In other words, the Fourier transform circuits determine a series of Fourier transforms of the respective signal processed over the predetermined time interval. Therein, the time intervals associated with consecutive Fourier transforms may overlap. As a result, the Fourier transformed signals comprise both time and frequency information.

Accordingly, the analysis circuit may average over several consecutive samples of the Fourier transformed signals in time domain and/or in frequency domain. In other words, the analysis circuit may perform the combined average over subsequent samples of the Fourier transformed signals, and/or over adjacent bins of the Fourier transformed signals.

In some embodiments, the Fourier transform circuits are each configured to determine a fast Fourier transform (FFT) of the respective signal processed.

The Fourier transforms of the respective signals may be determined online, i.e. in real-time or rather, live. In some embodiments, the Fourier transforms may be determined and be processed subsequently by the analysis circuit in real-time, such that a real-time analysis of the input signal received from the device under test is provided.

Alternatively or additionally, the Fourier transforms of the respective signals may be determined offline, i.e. based on samples of the input stored in a measurement memory. In some embodiments, the Fourier transforms may be determined and subsequently be processed by the analysis circuit offline.

The predetermined time interval may be adjustable by a user of the measurement system, e.g. via a suitable user interface.

Embodiments of the present disclosure further provide a measurement method of determining a corrected averaged power signal. In an embodiment, the measurement method comprises the following steps: receiving, by an input port, an input signal to be measured;
splitting, by a signal splitter, the input signal into a first signal and a second signal;
processing, by a first signal path, the first signal, thereby obtaining a first processed signal;
processing, by a second signal path, the second signal, thereby obtaining a second processed signal; performing, by an analysis circuit, a conjugate complex multiplication of the first processed signal and the second processed signal, thereby obtaining a complex-valued product signal; averaging, by the analysis circuit, the complex-valued product signal over a predetermined number of samples, thereby obtaining an averaged product signal; determining, by the analysis circuit, an averaged power signal based on the averaged product signal; and adding, by a control circuit, an offset to the averaged power signal directly or indirectly.

In some embodiments, embodiments of the measurement system described above are configured to perform the measurement method of determining a corrected averaged power signal.

Regarding the advantages and further properties of the measurement method, reference is made to the explanations given above with respect to the measurement system, which also hold for the measurement method and vice versa.

According to an aspect of the present disclosure, the offset is configured to compensate for anti-correlated thermal noise added by the signal splitter into the first signal path and the second signal path. The spectral collapse discussed above may at least partially be caused by the anti-correlated thermal noise that is added by the signal splitter into the first signal path and the second signal part path. Accordingly, by directly or indirectly adding the offset to the determined averaged power signal, the anti-correlated thermal noise caused by the signal splitter is compensated and measurements can reliably be conducted even in the vicinity of the thermal noise floor.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
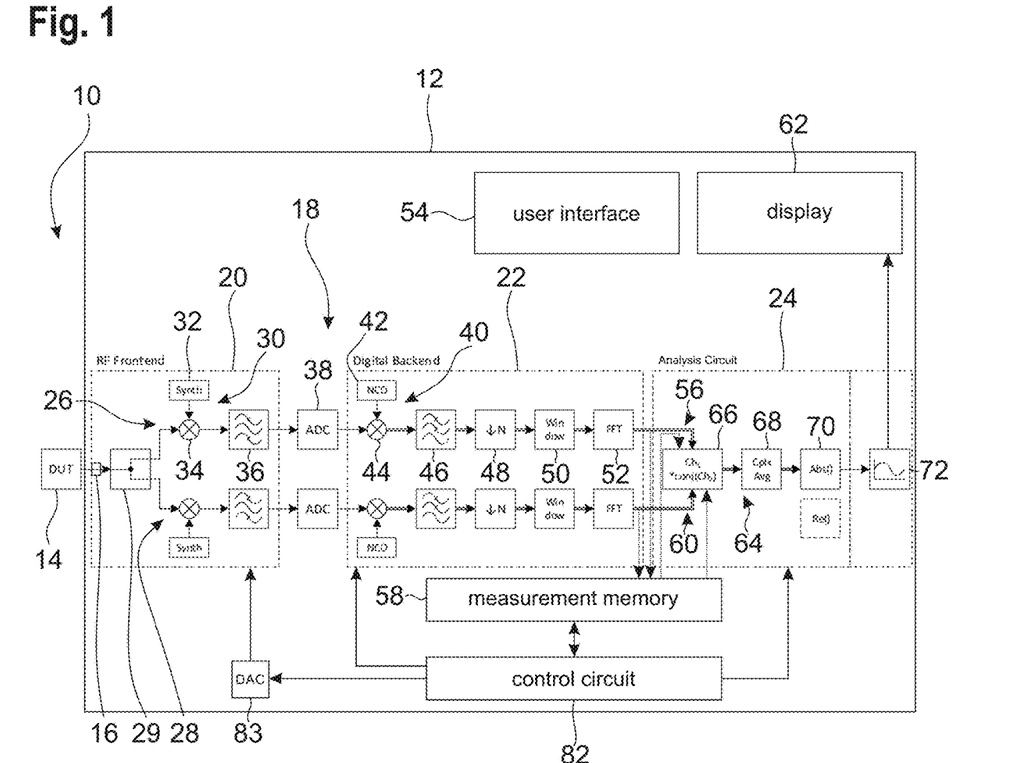
FIG. 1 schematically shows an example of a measurement system according to an embodiment of the present disclosure.

FIG. 1 schematically shows an example of a measurement system, generally designed 10, comprising a measurement instrument 12 and a device under test 14. In general, the measurement instrument 12 is configured to analyze an input signal received from the device under test 14 in order to analyze certain properties of the device under test 14.

For example, the measurement instrument 12 may be a signal analyzer, a spectrum analyzer, a phase noise tester, or an oscilloscope, for example a digital oscilloscope. However, the measurement instrument 12 may be established as any other type of measurement instrument, depending on which aspects of the performance of the device under test 14 are to be tested.

In some embodiments, the measurement instrument 12 is configured to measure a phase noise density of an input signal generated by the device under test 14, an amplitude noise power density of the input signal, a time domain power of the input signal, and/or an error vector magnitude of the input signal.

The device under test 14 may be established as any electronic device that is configured to generate a radio-frequency (RF) signal. For example, the device under test 14 comprises one or several electronic circuits generating an RF signal, wherein the performance of the electronic circuit(s) is assessed by the measurement instrument 12.

The device under test 14 is connected with the measurement instrument 12 in a signal-transmitting manner. Therein and in the following, the term "connected in a signal transmitting manner" is understood to denote a cable-based or wireless connection that is configured to transmit signals between the respective devices or components.

For example, the device under test 14 is connected to an input port 16 of the measurement instrument 12 via a suitable cable and suitable connectors, such that an electric signal output by the device under test 14 is transmitted from the device under test 14 to the measurement instrument 12 via the cable. Alternatively, the device under test 14 may transmit a wireless electromagnetic signal, which is received via an RF antenna connected to the input port 16. Alternatively, a measurement probe may be connected to the input port 16, wherein the measurement probe is configured to pick up an electric signal from the device under test 14 by contacting corresponding contact points of the device under test 14.

In the embodiment shown, the measurement instrument 12 comprises a signal processing circuit 18 having an RF frontend 20, a digital backend 22, and an analysis circuit 24. The measurement instrument 12 also comprises a first signal path 26 and a second signal path 28 that are each connected to the input port 16 via a signal splitter 29.

The signal splitter 29, which may also be called "power splitter", is configured to split the power of the input signal to be measured (i.e. the signal received from the device under test 14) equally to the first signal path 26 and to the second signal path 28. For example, the signal splitter 29 is established as a Wilkinson divider.

In the embodiment shown, the signal paths 26, 28 are arranged in parallel, such that the input signal received from the device under test 14 via the input port 16 and the signal splitter 29 is forwarded to and processed by both signal paths 26, 28 in parallel. The signal paths 26, 28 are functionally identical, i.e. the electronic components of the first signal path 26 are identical in construction to the electronic components of the second signal path 28. Thus, only the first signal path 26 is described in the following, as the explanations given hereinafter likewise apply to the second signal path 28.

The first signal path 26 comprises a first mixer sub-circuit 30 that is associated with the RF frontend 20 of the measurement instrument 12. In general, the first mixer sub-circuit 30 is configured to down-convert the input signal received from the device under test 14 to an intermediate frequency being suitable for processing by the electronic components downstream of the first mixer sub-circuit 30.

As usual, the first mixer sub-circuit 30 comprises a local oscillator input 32 that is configured to receive a local oscillator signal. The first mixer sub-circuit 30 further comprises a mixer unit 34 that is configured to mix the input signal received from the device under test 14 with the local oscillator signal, and a band-pass filter 36 that is configured to appropriately filter the resulting mixed signal in order to down-convert the input signal to the intermediate frequency.

Therein, the frequency of the local oscillator signal may be constant. Alternatively, the frequency of the local oscillator signal may be time-variant, i.e. a frequency sweep may be applied to the local oscillator signal.

The first signal path 26 also comprises an analog-to-digital converter (ADC) 38 that is configured to digitize the signal output by the first mixer sub-circuit 30. The first signal path 26 further comprises a second mixer sub-circuit 40 having an oscillator input 42, a mixer unit 44, and a filter unit 46.

In general, the second mixer sub-circuit 40 is configured to mix the digitized signal received from the ADC 38 into the complex baseband by any suitable technique known in the art. In some embodiments, the second mixer sub-circuit 40 may be configured to generate an IQ signal based on the digitized signal received from the ADC 38 by any suitable technique known in the art.

In some embodiments, the frequency of the local oscillator signal received via the oscillator input 42 may be constant. Alternatively, the frequency of the local oscillator signal received via the oscillator input 42 may be time-variant, i.e. a frequency sweep may be applied to the local oscillator signal.

In the example embodiment shown in FIG. 1, the first signal path 26 further comprises a down-converter unit 48, a window unit 50, and a Fourier transform circuit 52. The down-converter unit 48 is configured to down-sample the signal received from the second mixer sub-circuit 40 by a predetermined factor, i.e. to reduce the number of samples by a predetermined factor. The window unit 50 is configured to apply a window function to the signal output by the down-converter unit 48, thereby determining a resolution bandwidth of the signal paths 26, 28.

The resolution bandwidth may be fixed or may be adjustable. In some embodiments, the resolution bandwidth may be adjustable by a user via a user interface 54 of the measurement instrument 12.

In an alternative to the window unit 50 and the Fourier transform circuit 52, the first signal path 26 may comprise a resolution bandwidth filter, e.g. if time domain measurements are performed.

In embodiments having the Fourier transform circuit 52, the Fourier transform circuit is configured to determine a fast Fourier transform (FFT) of the signal output by the window unit 50, thereby obtaining a first processed signal. Accordingly, in this example embodiment of the measurement system 10, the first processed signal is established as a Fourier transformed signal.

In some embodiments, the Fourier transform circuit 52 may determine a series of Fourier transforms of the respective signal processed over a predetermined time interval. Therein, the time intervals associated with consecutive Fourier transforms may overlap.

Summarizing, an input signal received from the device under test 14 is processed by the electronic components of the first signal path 26 described above, thereby generating a first processed signal. Likewise, the input signal received from the device under test 14 is processed by the electronic components of the second signal path 28, thereby generating a second processed signal. The two parallel signal paths 26, 28 may be synchronized. In other words, the same portions of the input signal are processed by the two parallel signal paths 26, 28 simultaneously.

The first processed signal is forwarded to a first signal input 56 of the analysis circuit 24. Alternatively or additionally, the first processed signal is saved in a measurement memory 58 of the measurement instrument 12.

The second processed signal is forwarded to a second signal input 60 of the analysis circuit 24. Alternatively or additionally, the second processed signal is saved in the measurement memory 58.

In general, the analysis circuit 24 is configured to determine a phase noise power density associated with the input signal based on the first processed signal and based on the second processed signal. Alternatively or additionally, the analysis circuit 24 is configured to determine an amplitude noise power density, a time domain power, or an error vector magnitude associated with the input signal.

In the case of the time domain power, the window unit 50 and the Fourier transform circuit 52 may be replaced with a resolution bandwidth filter, as described above.

Without restriction of generality, the case of a phase noise power density being determined is described in the following.

The determined phase noise power density may then be displayed on a display 62 of the measurement instrument 12.

The input signal may be received from the device under test 14 and processed by the signal processing circuit 18, for example by the analysis circuit 24 in real time. Alternatively, the input signal may be received from the device under test 14 and processed by the signal paths 26, 28 as described above, and the processed signals may be saved in the measurement memory 58.

The saved processed signals may later be forwarded to the signal inputs 54, 58 for further processing by the analysis circuit 24.

In some embodiments, the analysis circuit 24 comprises an averaging sub-circuit 64 having a multiplication unit 66, an averaging unit 68, and an output unit 70. The multiplication unit 66 multiplies the first processed signal $FFT_1(k)$, which is a complex-valued signal, with a complex conjugate of the second processed signal $FFT_2^*(k)$, thereby obtaining a complex-valued product signal $FFT(k)$, i.e.

$$FFT(k)=FFT_1(k) \cdot FFT_2^*(k).$$

The averaging unit 68 is configured to average the complex-valued product signal over a predetermined number of samples N, thereby obtaining a (complex-valued) averaged product signal.

Figure 2:
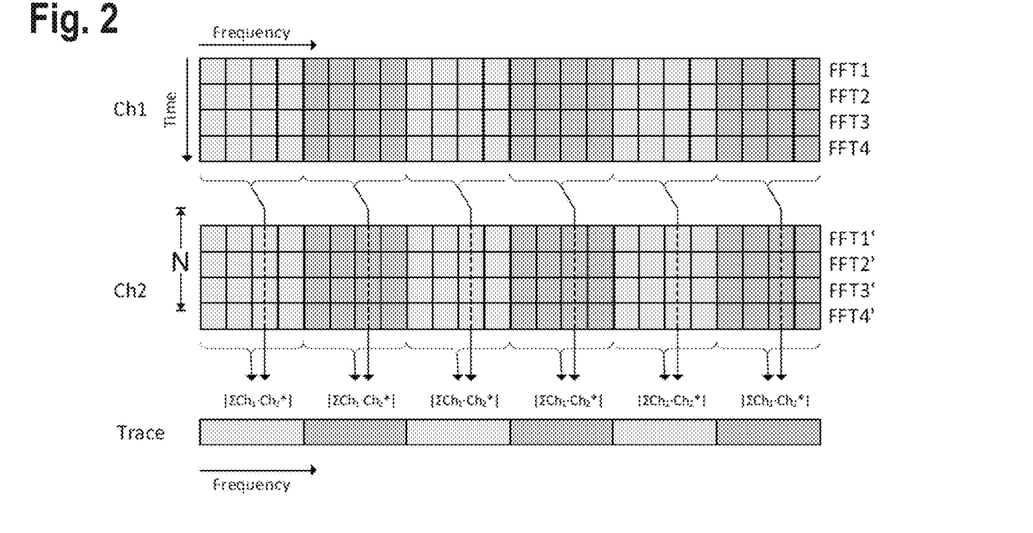
FIG. 2 shows a diagram illustrating an example of a combined average performed by the measurement instrument of FIG. 1.

In some embodiments, the averaging sub-circuit 64 or the averaging unit 68 may average a predetermined number of samples N of the Fourier transformed signals in time domain.

Alternatively or additionally, the averaging sub-circuit 64 or the averaging unit 68 may average the Fourier transformed signals over a predetermined number of samples in frequency domain.

In other words, the averaging sub-circuit 64 may perform a combined average over subsequent samples of the Fourier transformed signals, and/or over adjacent bins of the Fourier transformed signals.

As $y_1(k)=FFT_1(k)$ and $y_2*(k)=FFT_2(k)$ are in the frequency domain, the complex-valued averaged product signal may correspond to the trace of the cross-correlation matrix of the first processed signal and the second processed signal, divided by the predetermined number of samples N.

The output unit 70 determines the absolute value (Abs) of the averaged product signal or the real part (Re) of the averaged product signal, thereby obtaining an averaged power signal.

This way, noise originating in the signal paths 26, 28 cancels at least partially, while the wanted signal (including a noise contribution) of the device under test 14 is preserved (up to exceptions that are discussed below).

This can be seen as follows. The processed signals output by the digital backend 22 can be split into a correlated part from the device under test 14 (a) and two uncorrelated noise parts ($n_1$ and $n_2$) from the signal paths 26, 28:

$$y_1 = a + n_1,$$

$$y_2 = a + n_2$$

The output signal (Det) of the output unit 70 then is $$Det = \left| \frac{1}{N} \cdot \sum_{i=0}^{N-1} y_{1i} \cdot y_{2i}^* \right| = \left| \frac{1}{N} \cdot \sum_{i=0}^{N-1} |a_i|^2 + a_i \cdot n_{2i}^* + a_i^* \cdot n_{1i} + n_{1i} \cdot n_{2i}^* \right|$$

The first term, i.e. $1/N \Sigma |a_i|^2$, corresponds to the average power of the input signal received from the device under test 14 over frequency.

The further terms correspond to multiplications of uncorrelated signals, and thus cancel at least partially. More precisely, the further terms correspond to noise originating in the signal paths 26, 28.

In some embodiments, it has turned out that these unwanted noise contributions are reduced approximately by $5 \cdot \log_{10}(N)$ dB or by $1/\sqrt{N}$, respectively.

The result for the output signal Det given above corresponds to the absolute value of the averaged product signal.

Alternatively, the output signal Det may be given by $$Det = \text{Re}\left\{ \frac{1}{N} \cdot \sum_{i=0}^{N-1} y_{1i} \cdot y_{2i}^* \right\} = \text{Re}\left\{ \frac{1}{N} \cdot \sum_{i=0}^{N-1} |a_i|^2 + a_i \cdot n_{2i}^* + a_i^* \cdot n_{1i} + n_{1i} \cdot n_{2i}^* \right\}$$

As can be seen from a comparison of the two possible results for the output signal Det, the two results are the same for $N \to \infty$.

The predetermined number of samples N may be adjustable, e.g. via the user interface 54.

In some embodiments, the analysis circuit 24 further comprises a post-processing circuit 72 that receives the output signal of output unit 70. The post-processing circuit 72 is configured, for example, to determine a phase noise power density of the input signal based on the output signal of the output unit 70. Alternatively or additionally, the post-processing circuit 72 is configured to determine an amplitude noise power density, a time domain power, or an error vector magnitude of the input signal.

Without restriction of generality, the case of a phase noise power density being determined is described in the following. The explanations given in the following likewise apply to the amplitude noise power density, the time domain power, and the error vector magnitude.

The post-processing circuit 72 is further configured to generate visualization data associated with the determined phase noise power density, wherein the visualization data comprises a visual representation of the determined phase noise power density, which may be displayed on the display 62.

In general, increasing the predetermined number of samples N leads to an enhanced noise suppression, as the non-correlated portions of the noise, i.e. the unwanted noise portions, are suppressed more the larger the number of the predetermined samples N is.

However, due to an effect that is called "spectral collapse", the phase noise of the input signal may actually be measured too low, for example if the phase noise to be measured is near the thermal noise floor at k T, wherein k is the Boltzmann constant and T is the temperature. Thus, the phase noise power density determined by the post-processing circuit 72 may actually be too low.

Figure 3:
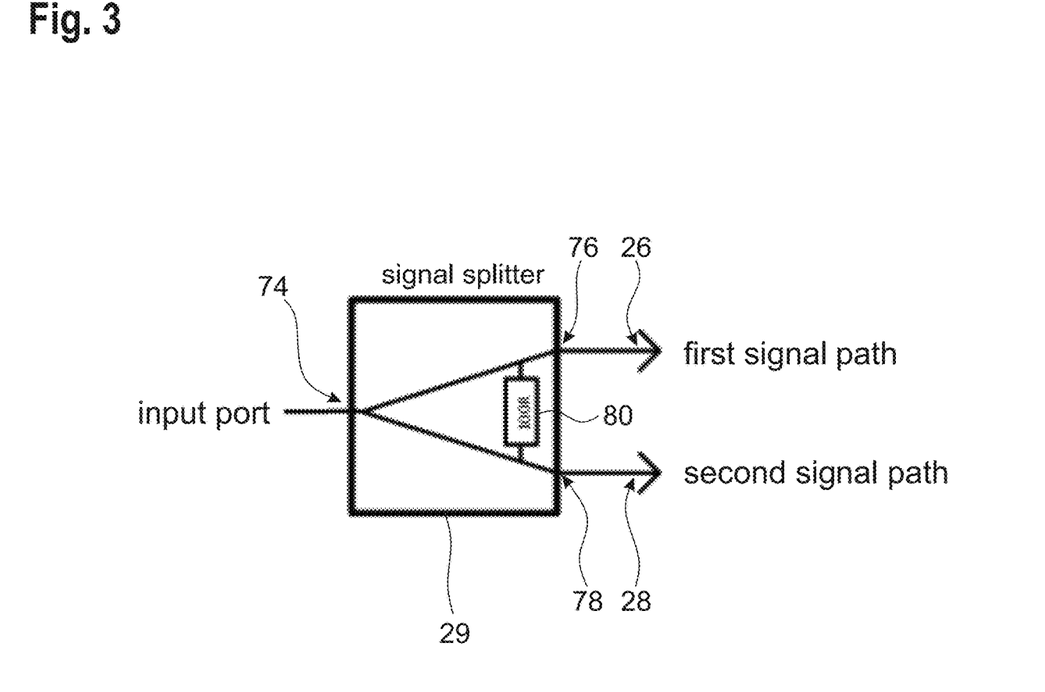
FIG. 3 schematically shows an example of a signal splitter of the measurement system of FIG. 1 in more detail.

This is at least partially caused by the signal splitter 29 that is shown in more detail in FIG. 3. In the embodiment shown in FIG. 3, the signal splitter 29 comprises a common port 74 that is connected with the input port 16 of the measurement instrument 12. The common port 74 corresponds to an input port of the signal splitter 29. The signal splitter 29 further comprises a first port 76 that is connected with the first signal path 26 and a second port 78 that is connected with the second signal path 28. The first port 76 and the second port 78 correspond to output ports of the signal splitter 29.

In order to provide isolation between the first port 76 and the second port 78, the signal splitter 29 comprises a resistor 80 that is interconnected between the first port 76 and the second port 78. For example, the resistor 80 may have an electric resistance of 100 Ohm.

Figure 4:
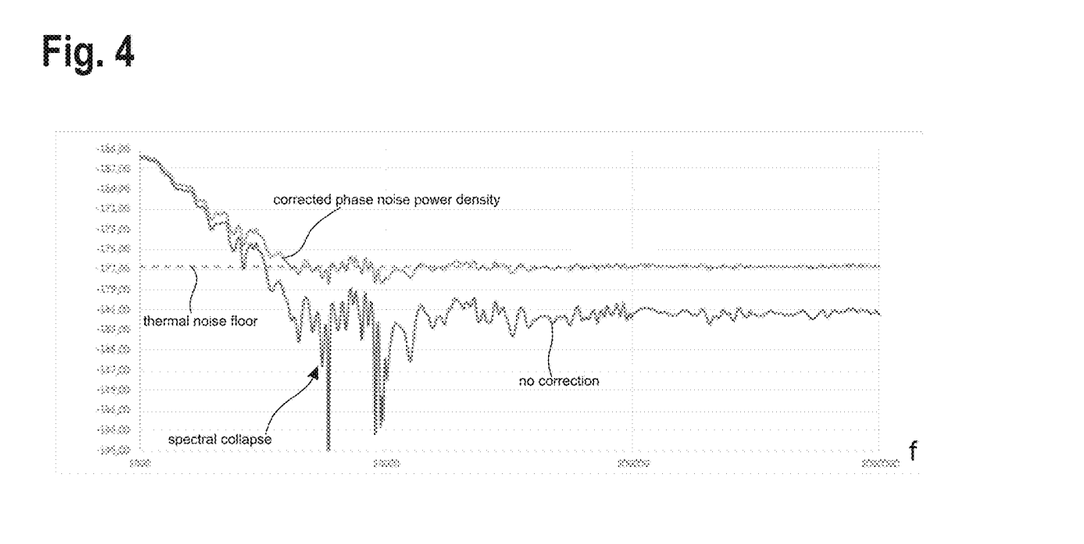
FIG. 4 shows a diagram of an example of a phase noise power density plotted against frequency.

However, due to the resistor 80, anti-correlated thermal noise is introduced into the first signal path 26 and the second signal path 28, wherein the power of the introduced anti-correlated thermal noise is k $T_R$, wherein $T_R$ is the temperature of the resistor 80. The resulting spectral collapse is illustrated in FIG. 4, which shows a plot of an uncorrelated phase noise power density ("no correction") against frequency f, as well as a corresponding correct result for the phase noise power density ("corrected phase noise power density"). As is clearly visible, the spectral collapse leads to deviations of the determined phase noise power density from the correct result, for example in a frequency region around and above 10 kHz.

As is illustrated in FIG. 1, the measurement instrument 12 further comprises a control circuit 82 that is configured to directly or indirectly add an offset to the averaged power signal and thus to the phase noise power density determined by the post-processing circuit 72 in order to compensate for the spectral collapse.

Therein and in the following, the term "directly" is understood to mean that a preliminary phase noise power density is determined by the post-processing circuit 72 and the offset is added to the preliminary phase noise power density in order to obtain the (corrected) phase noise power density.

Further, the term "indirectly" is understood to mean that an appropriate signal corresponding to the offset is added anywhere in the signal chain between the signal splitter 29 and the analysis circuit 24, including the analysis circuit 24.

For example, the control circuit 82 is configured to add the offset to the complex-valued product signal. Accordingly, the offset may be added to the phase noise power density indirectly by adding a (constant) signal to the complex-valued product signal, i.e. within the analysis circuit 24. Alternatively, the control circuit 82 may be configured to add the offset to the averaged product signal. Alternatively, the control circuit 82 may be configured to add the offset to the real value of the averaged product signal or to the absolute value of the averaged product signal. Alternatively, control circuit 82 may be configured to add a first partial offset in a digital portion of the first signal path 26 and a second partial offset in a digital portion of the second signal path 28. More precisely, the control circuit 82 may be configured to add the partial offsets downstream of the respective ADC 38 and upstream of the respective Fourier transform circuit 52.

In some embodiments, the first partial offset and the second partial offset are configured such that the resulting offset to the phase noise power density compensates for the unwanted spectral collapse.

In some embodiments, the first partial offset and the second partial offset may be equal to each other. In other words, the same partial offset this added to both signal paths 26, 28, such that the input signal is processed by the signal paths 26, 28 in a symmetric way.

In all the cases described above, the offset is added in a digital portion of the measurement instrument 12. Accordingly, the offset is established as a digital signal, for example as a digital wideband signal. Alternatively, the partial offsets may be analog signals that are added in an analog portion of the signal paths 26, 28, i.e. in the RF frontend 20 upstream of the ADCs 38 and downstream of the signal splitter 29.

The measurement system may comprise at least one digital-to-analog converter (DAC) 83, wherein the DAC 83 is configured to convert a digital signal corresponding to the offset or rather to the partial offsets into analog signals that are added before the ADCs 38. For example, the digital signal may be established as a wideband noise signal, such that the converted analog signals are an analog version of the wideband noise signal, respectively.

In some embodiments, the control circuit 82 may be configured to load the offset from a memory of the measurement instrument 12, e.g. from the measurement memory 58. For example, the offset may be obtained by a manufacturer of the measurement instrument 12 during production or rather during calibration of the measurement instrument 12. Alternatively or additionally, the offset may be determined as is described in the following with reference to FIG. 5.

Figure 5:
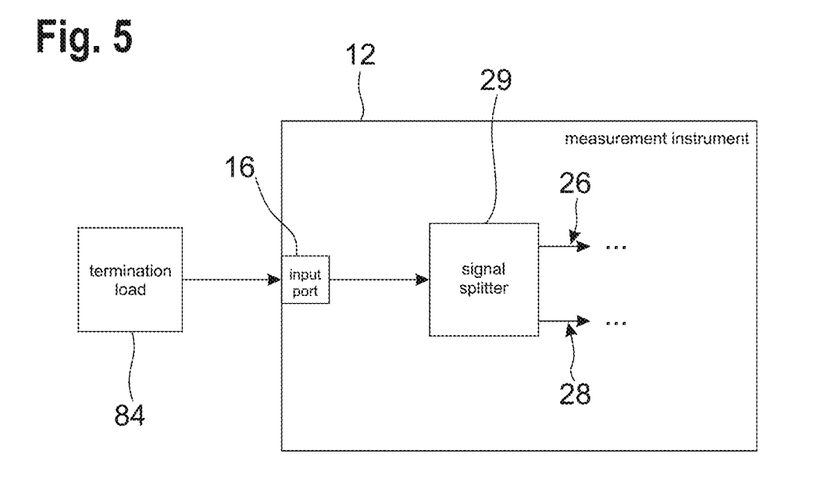
FIG. 5 shows another embodiment of the measurement system of FIG. 1.

A termination load 84 having a predefined electric resistance is provided, wherein the termination load 84 is connected to the input port 16. For instance, the electric resistance of the termination load may be between 30 and 100 Ohm, e.g. about 50 Ohm.

The termination load 84 has a known phase noise characteristic, as the phase noise generated by the termination load 84 corresponds to k T. Thus, the measurements described above may be performed on the termination load 84, i.e. the measurement instrument 12 may determine a phase noise power density of the signal provided by the termination load 84 as described above for the device under test 14.

The determined phase noise power density of the termination load 84 may be compared with the known thermal floor of the termination load 84, i.e. with k T. The offset may be determined based on a difference between the determined phase noise power density of the termination load 84 and the thermal floor k T.

In some embodiments, the analysis circuit 24 or the control circuit 82 may be configured to determine the offset based on the determined phase noise power density of the termination load 84 and based on the known thermal floor of the termination load 84.

In other words, the offset $P_{corr}$ may be determined according to $P_{corr}=k \cdot T - P_{meas}$, wherein $P_{meas}$ is the phase noise power density of the termination load 84 determined as described above.

In the example embodiment of FIG. 5, the termination load 84 is provided separately from the measurement instrument.

Figure 6:
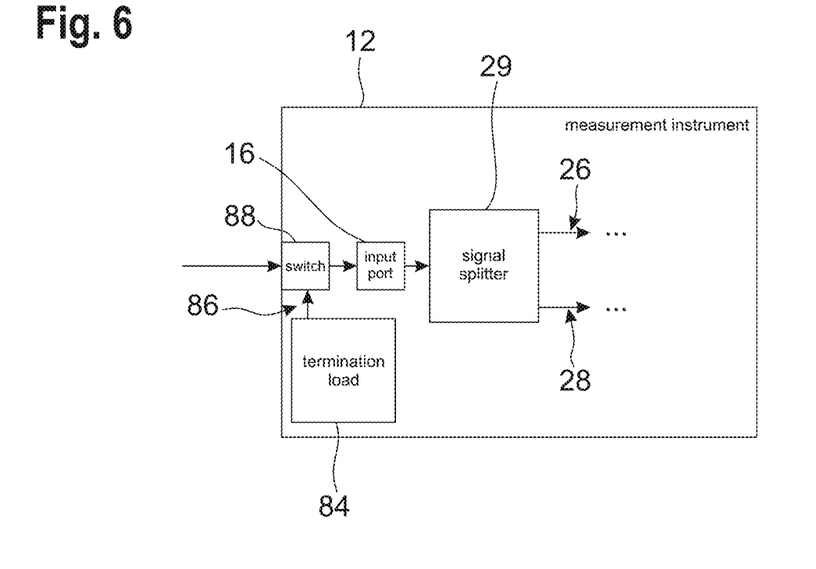
FIG. 6 shows another embodiment of the measurement system of FIG. 1.

As is illustrated in FIG. 6, the measurement instrument 12 may comprise an internal calibration line 86 that is integrated into the measurement instrument 12. Further, the termination load 84 is integrated into the measurement instrument 12, and is connected to the input port 16 via the internal calibration line 86 and a switch 88.

The switch 88 is configured to selectively connect the termination load 84 or an external input signal with the input port 16. In other words, if the termination load 84 is connected with the input port 16, external signals may be switched off by the switch 88.

Thus, the measurement system 10 or the measurement instrument 12 may be configured to self-calibrate by connecting the termination load 84 to the input port 16 and determining the offset as described above.

As the termination load 84 is integrated into the measurement instrument 12, the temperature of the termination load 84 may be equal to the temperature of the signal splitter 29. Thus, a particularly precise calibration of the offset may be performed.

Figure 7:
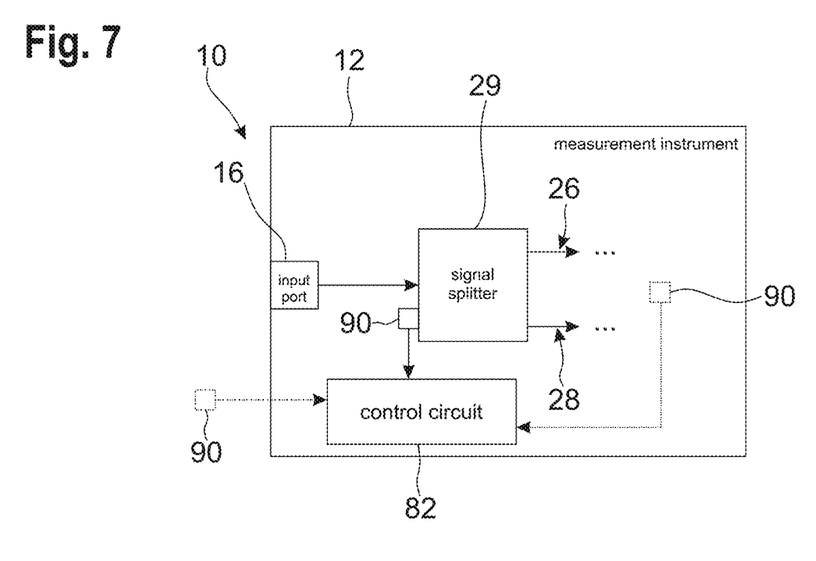
FIG. 7 shows another embodiment of the measurement system of FIG. 1.

Another embodiment of the measurement system 10 is shown in FIG. 7, wherein it is to be understood that the additional aspects described in the following may be arbitrarily combined with the variants of the measurement system 10 described above.

In the embodiment shown in FIG. 7, the measurement system 10 comprises at least one temperature sensor 90 that is connected with the control circuit 82 in a signal-transmitting manner. The at least one temperature sensor 90 is configured to measure a temperature of the signal splitter 29, an operating temperature of the measurement instrument 12, and/or an ambient temperature. In general, the control circuit 82 may be configured to determine the offset based on the temperature of the signal splitter 29, based on the operating temperature and/or based on the ambient temperature.

The noise floor rises with rising temperature, as the energy of the noise floor scales with k T temperature. Likewise, the amount of anti-correlated noise added by the signal splitter 29 to the first signal path 26 and to the second signal path 28 scales with the temperature of the signal splitter 29. This effect may be accounted for by determining the offset based on the temperature of the signal splitter 29, based on the operating temperature and/or based on the ambient temperature.

In other words, the determined phase noise power density is corrected with a temperature-dependent offset. In some embodiments, the phase noise power density is corrected for the temperature-dependent anti-correlated noise added by the signal splitter 29 to the first signal path 26 and to the second signal path 28 with a temperature-dependent offset.

For example, only the ambient temperature may be measured. During operation, the temperature of the signal splitter 29 can then be assumed to be higher than the ambient temperature by a characteristic difference, e.g. by 20 to 40° C. In other words, the temperature of the signal splitter 29 may be estimated based on the measured ambient temperature.

Likewise, the temperature of the signal splitter 29 may be estimated based on the operating temperature of the measurement instrument 12, which may be measured at any point of the measurement instrument 12 other than the signal splitter 29 itself.

For example, the control circuit 82 may comprise a lookup-table comprising the temperature of the signal splitter 29 in dependence of the operating temperature of the measurement instrument 12. As another example, the temperature of the signal splitter 29 may be measured directly. As a further example, the temperature of the signal splitter 29 may be estimated. For example, the temperature of the signal splitter 29 may be estimated to be a usual operating temperature of the signal splitter 29.

In a particular example, the control circuit 82 may load a preliminary offset from the measurement memory 58. The control circuit 82 may adapt the preliminary offset based on the temperature of the signal splitter 29, based on the operating temperature of the measurement instrument 12 and/or based on the ambient temperature in order to obtain the offset that is added to the phase noise power density.

As the actual temperature of the signal splitter 29 may differ from the usual operating temperature of the signal splitter 29, the preliminary offset may be corrected for the difference between the actual temperature of the signal splitter 29 and the usual operating temperature of the signal splitter 29.

In some embodiments, the actual temperature of the signal splitter 29 may be determined as described above.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry one or more processors or portions thereof and accompanying software, firmware, hardware, and the like.

In some embodiments, the program instructions, when executed by the processor or a processing circuit, is configured to carry out the functionality of the signal processing circuit 18, or parts thereof. In that regard, the processor and/or memory storing the program instructions forms a special purpose processor and/or control circuit specifically configured to carry out the methodologies and technologies described herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified herein.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system, comprising:
   an input port is configured to receive an input signal to be measured;
   a first signal path and a second signal path;
   a signal splitter comprises a common port that is connected to the input port so as to receive the input signal from the input port, a first port that is connected to the first signal path and a second port being connected to the second signal path, wherein the signal splitter is configured to split the input signal into a first signal that is forwarded to the first signal path and a second signal that is forwarded to the second signal path,
   the first signal path configured to process the first signal, thereby obtaining a first processed signal, and the second signal path configured to process the second signal, thereby obtaining a second processed signal,
   an analysis circuit connected to the first signal path and the second signal path so as to receive both the first processed signal and the second processed signal, wherein the analysis circuit is configured to: perform a conjugate complex multiplication of the first processed signal and the second processed signal, thereby obtaining a complex-valued product signal; average the complex-valued product signal over a predetermined number of samples, thereby obtaining an averaged product signal; and determine an averaged power signal based on the averaged product signal; and
   a control circuit configured to directly or indirectly add an offset to the averaged power signal.

2. The measurement system of claim 1, wherein the offset is configured to compensate for anti-correlated thermal noise added by the signal splitter into the first signal path and the second signal path.

3. The measurement system of claim 1, wherein the control circuit is configured to add the offset to the complex-valued product signal.

4. The measurement system of claim 1, wherein the averaged power signal is associated with a phase noise power density, an amplitude noise power density, a time domain power measurement, or an error vector magnitude measurement.

5. The measurement system of claim 1, wherein the control circuit is configured to add the offset to the averaged product signal.

6. The measurement system of claim 1, wherein the analysis circuit is configured to determine an absolute value of the averaged product signal or a real value of the averaged product signal, and wherein the control circuit is configured to add the offset to the absolute value of the averaged product signal or the real value of the averaged product signal.

7. The measurement system of claim 1, wherein the control circuit is configured to add a first partial offset in the first signal path and a second partial offset in the second signal path.

8. The measurement system of claim 7, wherein the first partial offset is equal to the second partial offset.

9. The measurement system of claim 7, wherein the first signal path and the second signal path each comprise an analog-to-digital converter, respectively, wherein the first partial offset and the second partial offset are established as a digital signal that is added after the analog-to-digital converter, respectively.

10. The measurement system of claim 7, wherein the first signal path and the second signal path each comprise an analog-to-digital converter, respectively, wherein the first partial offset and the second partial offset are established as an analog signal that is added before the analog-to-digital converter, respectively.

11. The measurement system of claim 1, wherein the first port and the second port of the signal splitter are isolated from each other.

12. The measurement system of claim 1, wherein the signal splitter is a Wilkinson divider.

13. The measurement system of claim 1, wherein the measurement system is configured to measure a temperature of the signal splitter, an operating temperature of the measurement system and/or an ambient temperature, and wherein the control circuit is configured to determine the offset based on the temperature of the signal splitter, based on the operating temperature and/or based on the ambient temperature.

14. The measurement system of claim 13, wherein the control circuit is configured to load a preliminary offset from a memory, and wherein the control circuit is configured to adapt the preliminary offset based on the temperature of the signal splitter, based on the operating temperature and/or based on the ambient temperature in order to obtain the offset that is added to the averaged power signal.

15. The measurement system of claim 1, further comprising a termination load having a predefined electric resistance, wherein the termination load is connected to the input port, or wherein the termination load is connectable to the input port by a switch.

16. The measurement system of claim 15, wherein the termination load is integrated into the measurement system, wherein the measurement system comprises an internal calibration line, wherein the internal calibration line is connected to the termination load, and wherein the internal calibration line is connectable to the input port by a switch.

17. The measurement system of claim 1, wherein the first signal path and the second signal path are functionally identical.

18. The measurement system of claim 1, wherein the first signal path and the second signal path each comprise a Fourier transform circuit, wherein the Fourier transform circuits are each configured to determine a Fourier transform of the respective signal processed in the respective signal path over a predetermined time interval.

19. A measurement method of determining a corrected averaged power signal, the measurement method comprising the following steps:
  receiving, by an input port, an input signal to be measured;
  splitting, by a signal splitter, the input signal into a first signal and a second signal;
  processing, by a first signal path, the first signal, thereby obtaining a first processed signal;
  processing, by a second signal path, the second signal, thereby obtaining a second processed signal;
  performing, by an analysis circuit, a conjugate complex multiplication of the first processed signal and the second processed signal, thereby obtaining a complex-valued product signal;
  averaging, by the analysis circuit, the complex-valued product signal over a predetermined number of samples, thereby obtaining an averaged product signal;
  determining, by the analysis circuit, an averaged power signal based on the averaged product signal; and
  adding, by a control circuit, an offset to the averaged power signal directly or indirectly.

20. The measurement method of claim 19, wherein the offset is configured to compensate for anti-correlated thermal noise added by the signal splitter into the first signal path and the second signal path.

* * * * *